United States Patent [19]
Fujii

[11] Patent Number: 5,523,660
[45] Date of Patent: Jun. 4, 1996

[54] MOTOR CONTROL CIRCUIT AND MOTOR DRIVE SYSTEM USING THE SAME

[75] Inventor: Norio Fujii, Ukyo-ku, Japan

[73] Assignee: Rohm Co., Ltd., Kyoto, Japan

[21] Appl. No.: 86,201

[22] Filed: Jul. 6, 1993

[51] Int. Cl.$^6$ ..................................................... H02P 7/00
[52] U.S. Cl. .......................... 318/254; 318/801; 318/439; 323/223; 323/265; 327/480; 327/490
[58] Field of Search ...................................... 307/801–809, 307/280, 281, 341, 296.6, 296.8, 272.3, 296.1, 350, 354–355, 363, 309–310, 304, 297, 446, 451, 248; 323/223, 283, 284, 281, 265, 288, 314; 318/254, 439, 138, 139

[56] References Cited

U.S. PATENT DOCUMENTS

| 4,464,588 | 8/1984 | Wieser | 307/297 |
| 4,634,956 | 1/1987 | Davis et al. | 323/222 |
| 4,908,527 | 3/1990 | Van Antwerp | 307/309 |
| 4,922,131 | 5/1990 | Anderson | 307/354 |
| 4,939,442 | 7/1990 | Carvajal et al. | 323/281 |
| 5,087,891 | 2/1992 | Cytera | 307/296.8 |
| 5,160,873 | 11/1992 | Tukiyama et al. | 318/254 |
| 5,187,389 | 2/1993 | Hall et al. | 307/272.2 |
| 5,229,658 | 7/1993 | Ide et al. | 307/446 |
| 5,289,425 | 2/1994 | Horiguchi et al. | 307/296.6 |

*Primary Examiner*—William M. Shoop, Jr.
*Assistant Examiner*—John W. Cabeca
*Attorney, Agent, or Firm*—Fay, Sharpe, Beall, Fagan, Minnich & McKee

[57] ABSTRACT

A first current mirror circuit for driving a first output stage transistor to flow out current to a coil in a motor is disposed between a power source voltage line and a reference voltage line, and a second current mirror circuit for driving a second output stage transistor to receive a current flowing out from the coil of the motor is disposed between a reference voltage line and a ground line.

19 Claims, 3 Drawing Sheets

MOTOR CONTROL CIRCUIT AND MOTOR DRIVE SYSTEM USING THE SAME

Background of the Invention

1. Field of the Invention

The present invention relates to a motor control circuit and a motor drive system using the same and more specifically relates to a motor control circuit and a motor drive system using the same which are used for such as a video tape recorder, a flexible disk drive device (FDD), a hard disk drive device (HDD) and a magneto-optical disk drive device in which the power consumptions are reduced as well as noises caused by switching operation of a transistor in a final output stage thereof (hereinbelow simply called as output stage) are suppressed.

2. Description of Related Art

FIG. 4 is a conventional control circuit diagram of this kind for a three phase motor.

The motor control circuit comprises a motor 1, a sensing circuit 2, an input amplifying circuit 3, a drive signal generating circuit 4 and a three phase motor drive circuit 5 (hereinafter called as a drive circuit 5).

The motor 1 comprises three coils 11, 12, and 13 to which drive currents having phase differences by about 120° each other are flowed to rotate the motor 1.

The sensing circuit 2 is constituted by three Hall elements as its major components, senses a rotating phase of the motor 1 and outputs a phase detection signal (hereinbelow simply called as detection signal) in a form of voltage signal (a current signal is also applicable) having a sinusoidal waveform or the like. The respective Hall elements are always kept in their operative conditions by the current flowing from the power source line Vcc to the ground line GND via resistors.

The input amplifying circuit 3 is constituted by three differential amplifiers 3a, 3b and 3c as its major components, amplifies the detection signal from the sensing circuit 2 and sends out the same to the drive signal generating circuit 4.

The drive signal generating circuit 4 receives the three amplified signals from the respective differential amplifiers and produces based upon the received signals three drive signals Ka, Kb and Kc of which phases deviate by about 120° each other and, for example, advance by 30° with respect to the respective detection signals, and these produced drive signals are outputted to the drive circuit 5.

The drive signal generating circuit 4 is applied with a rotating speed setting signal W for setting the rotating speed of the motor 1 from the outside and produces the drive signals Ka, Kb and Kc of which amplitudes are varied in response to the condition of the signal W so that the motor rotates at a target rotating speed commanded by the signal W.

Now, the drive circuit 5 is explained hereinafter, since three current drive circuits 5a, 5b and 5c in the drive circuit 5 have the same constitutions, the current drive circuit 5a is explained in detail and the explanation of the other current drive circuits 5b and 5c is omitted.

The current drive circuit 5a receives the drive signal Ka and produces a drive current Pa having a waveform according to the drive signal. Here the drive signal Ka is assumed in a form of voltage signal (a current signal is also applicable), and both cases when the voltage value is positive and negative are explained.

When the value of the drive signal Ka is negative or a current flows out, the drive signal Ka is current-amplified by a flow-in control circuit 6 and an output stage transistor Q4 connected thereto and the drive current Pa flows-in from a coil of the motor 1 to sink the same to the ground terminal GND.

Contrary, when the value of the drive signal Ka is positive or a current flows in, a circuit arrangement, which is constituted by a PNP transistor Q1 in diode connection receiving the drive signal Ka, a PNP transistor Q2 constituting a current mirror circuit together with the transistor Q1 and an NPN transistor Q3 in Darlington connecion to the transistor Q2 constituting an output stage, current-amplifies the drive signal Ka and the drive current Pa is supplied to a coil of the motor 1 from the power source line Vcc.

However, in the conventional motor control circuits of this kind, the voltage induced in the coil may increase as high as near the voltage of the power source line Vcc when the drive current Pa is supplied depending upon the value of the target rotating speed set by the rotating speed setting signal W and load conditions. For this reason, the collector-emitter voltage of the transistor Q3 constituting the output stage decreases too low, in other words, the emitter voltage of the transistor Q3 increases too high to maintain the operating voltage between the base and emitter thereof. Thereby, the transistor Q3 may temporarily cut off or the operating point thereof may shift toward the cut-off side.

Due to this cut off operation of the transistor, the transistor is switched to thereby cause noises. Such conventional art illustrated in FIG. 4 and the problem thereof are explained in U.S. Pat. No. 5,264,774 assigned to the present assignee.

Moreover, in the above instance, the terminal voltage of the transistor Q3 constituting the output stage gives at the highest condition a voltage dropped by a voltage component of 1Vf=Vsat from the power source line voltage Vcc. Accordingly, a so-called ineffective power consumption, which is consumed in the output stage and never contributes for generating an actual rotating force for the motor, is comparatively large.

In such motor drive circuit having a conventional structure wherein a current mirror circuit is arranged in a fore stage of the output stage and an NPN transistor is used for the output stage, the drive signal is once amplified via the current mirror circuit and the amplified drive signal is used as a current for driving the base of the output stage. When such as a current mirror circuit and a Darlington connection are used for driving an output stage transistor and as well an NPN transistor having a high amplification rate is used for the output stage as in the conventional circuit, a signal which is treated in pre-stage circuits of the drive circuit 5 such as the drive signal generating circuit 4 and the input amplifying circuit 3 can be a signal of a small current, as a result, power consumption in the motor drive circuit can be saved as a whole.

However, in a field of recent office automation machines incorporating a motor drive device including such as FDD and HDD there is a keen demand of downsizing and lower power consumption for the motor drive device. In particular such demand of lower power consumption is especially keen for the motor drive circuit such as in a battery driven FDD mounted on such a note type personal computer and a portable wordprocessor it becomes difficult to fully satisfy such demand with the conventional motor drive circuit having the above explained structure.

SUMMARY OF THE INVENTION

An object of the present invention is to provide a motor drive circuit which enables to further reduce power consumption therein.

Another object of the present invention is to provide a motor drive circuit which enables to further reduce power consumption therein and suppresses noises caused by a switching operation of an output stage transistor therein.

A further object of the present invention is to provide a motor drive system which enables to further reduce power consumption therein and suppresses noises caused by a switching operation of an output stage transistor therein.

In a drive circuit wherein a current mirror circuit is used for driving an output transistor, a current in a pre-stage prior to the mirror circuit can be limited small, therefore major circuits in the drive circuit which consume substantiall electric power are the current mirror circuit and the output stage transistor driven by the current mirror circuit. Accordingly, in order to reduce the power consumption in the drive circuit, it is effective to suppress a power consumption in these circuits.

In the circuit of FIG. 2, the output stage transistor Q3 in the above drive circuit 5 is replaced by a PNP transistor, in order to obtain an equivalent output current with the conventional NPN transistor, the drive stage of the current mirror circuit is modified to a multi emitter type transistor having a high current ratio of input side and output side (which is equivalent to a parallel connection of a plurality of transistors) and the ground line GND is used as a voltage reference. In accordance with the above modification a current mirror circuit in a drive stage corresponding to an output stage transistor Q4 in a current sink side is modified to a circuit using the power souce line Vcc as a reference.

Through the replacement of the transistor Q3 to the NPN transistor the maximum voltage at the output terminal can be raised upto a voltage which is dropped only by a voltage component of Vsat from the voltage source line of Vcc. Since the voltage component Vsat is usually at above 0.2 V the voltage of the output terminal can be raised to a voltage substantially equal to the power source voltage so that the switching operation of the output stage transistor is suppressed and the generation of noises is suppressed. Moreover, since the voltage between the emitter-collector of the output stage is lowered to about 0.2 V, an ineffective power consumption at this portion is reduced to achieve a reduction of power consumption. However, it is found out that with the above measure alone the demand for reduction of power consumption can not be fully satisfied. Hereinbelow reasons thereof are explained.

In FIG. 2, numerals 7 and 8 designate current mirror circuits, and, in the present example, the current mirror circuit 7 and a PNP transistor Q3a constitute a drive circuit for a current flow-out side and the current mirror circuit 8 and an NPN transistor Q4b constitute a drive circuit for a current sink side. In order to facilitate explanation of the operation, the transistor Q4b there is not an output stage transistor for the current sink side which forms a pair with the transistor Q3a but an output stage transistor for a current sink side in another drive circuit.

In case of a three phase, the respective phase coils are usually connected at a neutral point, therefore when these coils are viewed from the output side of the drive circuit 5, for example the coils 11 and 12 connected at the neutral point in FIG. 3 are viewed as a single coil connected in series and when the single coil is represented by a coil la, the coil la is connected between the collector of the transistor Q3a and the collector of the transistor Q4b in the drive circuit 5.

During a three phase motor drive, one or two of the three drive circuits work as a current flow-out side and the other two or one of the three drive circuits work as a current sink side, however, in order to simplify the explanation, the operation is explained by making use of circuits for a current flow-in side and a current sink side with respect to the coil 1a.

An output stage in a drive circuit which outputs to one of three phase coils is constituted by transistors Q3a and Q3b, and another output stage in another drive circuit which outputs to another of three phase coils is constituted by transistors Q4a and Q4b. The output terminal 3C of the transistor Q3a and the output terminal 4C of the transistor Q4b are respectively connected to respective coils of different phases among the three phase coils.

The current mirror circuit 7 is constituted by NPN transistors Q1 and Q20 and the collector of the transistor Q1 at the input side receives one of drive signals from the drive signal generating circuit 4 as a flow-in current IK1 (which is a flow-in current signal corresponding to the drive signal Ka in FIG. 4 or when the drive signal is a voltage signal a converted signal into current from the voltage signal). The transistor Q20 at the output side inverts and amplifies the same to generate a current signal IB3 at the collector side and applies the generated current signal IB3 to the base of the transistor Q3a to drive the same. The output stage transistor Q3a further amplifies the applied current signal and causes to flow-out a motor drive current Ia from the power source line Vcc to the coil 1a (a series circuit of coils 11 and 12 in FIG. 3) of the motor 1.

The current mirror circuit 8 is constituted by PNP transistors Q5 and Q6 and the collector of the transistor Q6 at the input side receives another drive signal from the drive signal generating circuit 4 as a flow-out current IK6 (which is a flow-out current signal corresponding to the drive signal Kb or Kc in FIG. 4 or when the drive signal Kb or Kc is a voltage signal a converted signal into current from the voltage signal). The transistor Q5 inverts and amplifies the same to generate a current signal IB4 at the collector The output stage NPN transistor Q4b further thereof. amplifies the applied current signal and causes to sink the motor drive current Ia to the ground line GND. In the above condition the other output stage transistors Q3b and Q4a which are connected to the coil la are turned off. However, at another timing the on/off condition of the output stage transistors Q3a and Q4b and the output stage transistors Q3b and Q4a switches according to driving signal s so that the direction of the drive current flowing through the coils of the motor is inverted. Further, it is a matter of course that an output stage drive circuit corresponding to the current mirror circuit 7 is provided for the output stage transistor Q3b and an output stage drive circuit corresponding to the current mirror circuit 8 is provided for the output stage transistor Q4a, however illustration thereof is omitted for avoiding complexity of the drawing.

When the current mirror circuits as explained above are used, an electric power consumed in the respective current mirror circuits provided in the current drive circuits for respective phases is comparatively large, therefore a total power consumption in the drive circuit can not be sufficiently reduced even if the measure is taken which replaces the output stage transistor to a PNP transistor for reducing power consumption in the circuit.

Accordingly, the motor drive circuit according to the present invention is an improvement of the circuit shown in FIG. 2. A feature of the present invention resides in a provision of an upstream side line from which a current flows out, a downstream side line having a lower potential than that of the upstream side line which receives the flow-out current, a reference voltage line having an intermediate potential between those of the upstream side line and of the downstream side line, a first output stage transistor which causes to flow out the current from the upstream side line to a coil in the motor, a first current mirror circuit which is disposed between the upstream side line and the reference voltage line and is adapted to drive the first output stage transistor, a second output stage transistor which receives a current flowing out from the coil in the motor, and second current mirror circuit which is disposed between the reference voltage line and the downstream side line and is adapted to drive the second output stage transistor.

In the motor drive circuit having the above explained structure, the first current mirror circuit disposed between the upstream line and the reference voltage line operates through a supply of voltage and current necessary for its operation. The current necessary for its operation is the sum of the drive signal current and the base current as illustrated in FIG. 2. Since the first current mirror circuit operates between the upstream line side and the reference voltage side, the first current mirror circuit operates under a smaller potential difference than the case in FIG. 2, accordingly the power consumption thereby is reduced by the corresponding difference.

The second current mirror circuit disposed between the reference voltage line and the downstream side line operates through a supply of voltage and current necessary for its operation. In this instance too like the above instance, the second current mirror circuit operates under a smaller potential difference than the case in FIG. 2, accordingly the power consumption thereby is reduced by the corresponding difference.

In the above instance, a new reference voltage line is necessary and when there is no separate power source circuit which permits generation of a reference voltage, it is necessary to provide a new circuit such as a constant voltage generating circuit which generates a reference voltage. However, an opearting current for such constant voltage generating circuit is a difference current between the currents necessary for the operation of the first and second current mirror circuits, therefore its power consumption is limited. The power consumption increased by the newly introduced constant voltage generating circuit can be easily kept low below either of the saved power consumptions achieved by the respective provisions of the first and second current mirror circuits.

As a result, the power consumption is saved over the increase of power consumption and a further reduction of power consumption in the motor drive circuit is achieved.

BRIEF OF THE DRAWINGS

DESCRIPTION OF A PREFERRED EMBODIMENT

Figure 1:
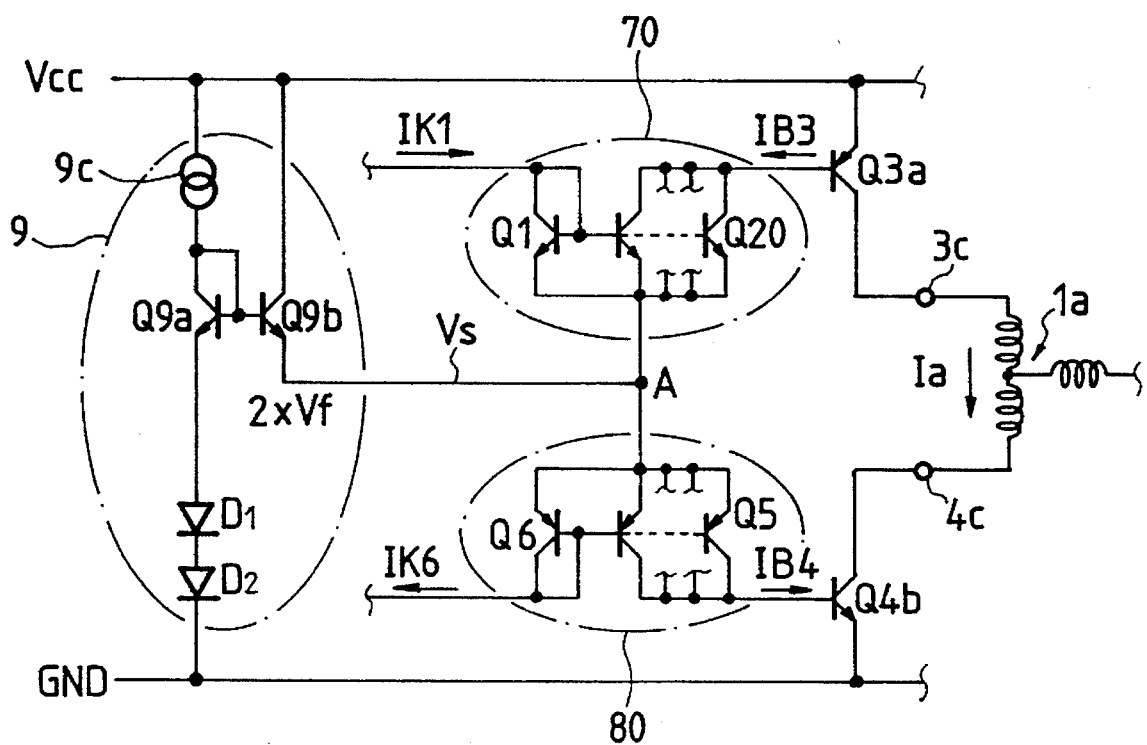
FIG. 1 is one embodiment of motor drive circuits according to the present invention illustrating a circuit diagram including a drive circuit as its major part.
Figure 4:
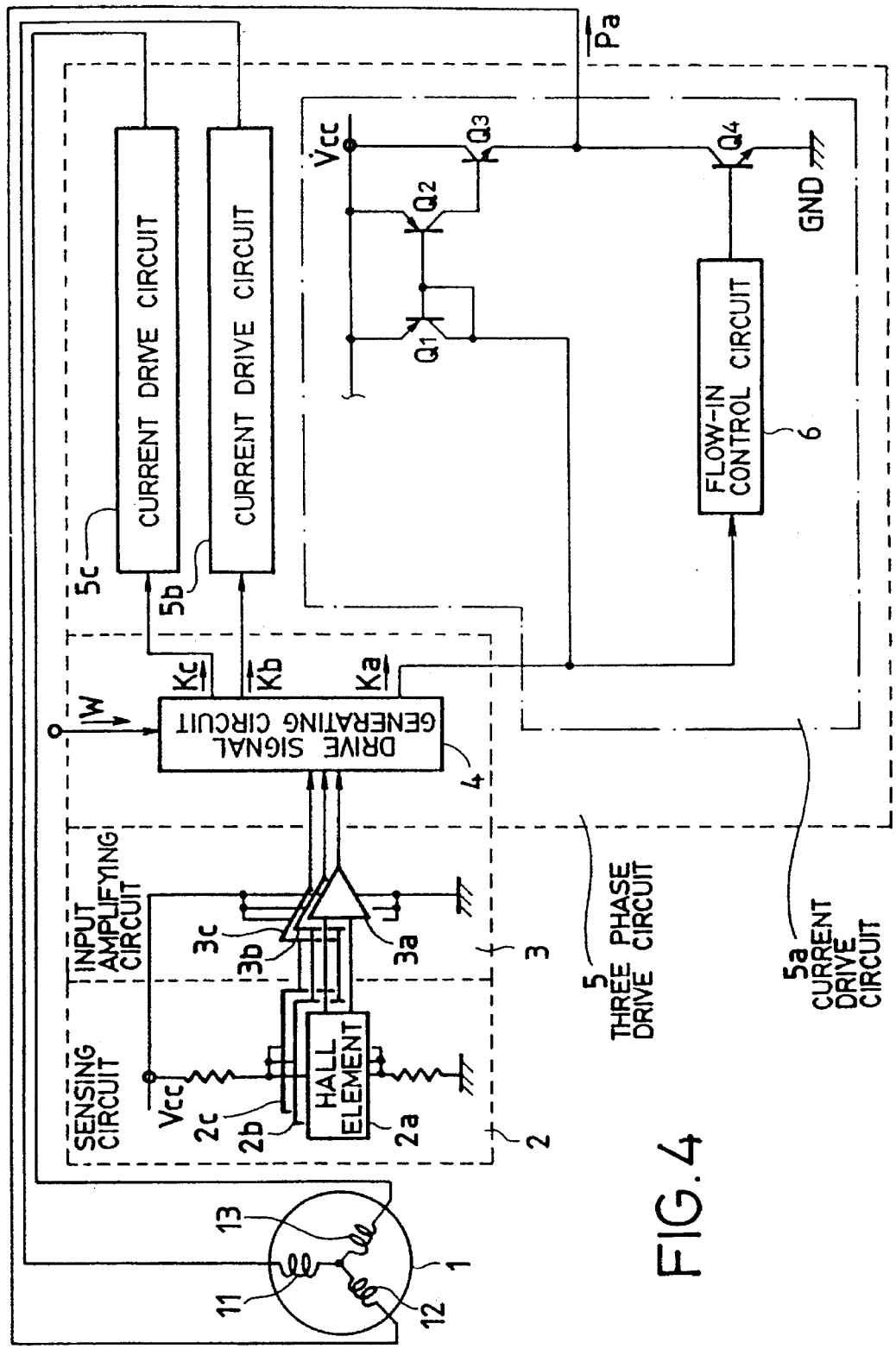
FIG. 4 is a block diagram of a conventional motor drive circuit such as for a FDD.

An entire structure of the motor drive circuit according to the present invention is substantially the same as that illustrated in FIG. 4 except for the structure of the drive circuit. The circuit shown in FIG. 1 is an example of the drive circuits which is again different from the drive circuit shown in FIG. 2. Now, hereinbelow the drive circuit shown in FIG. 1 is explained while referring back to the circuit shown in FIG. 2.

Figure 2:
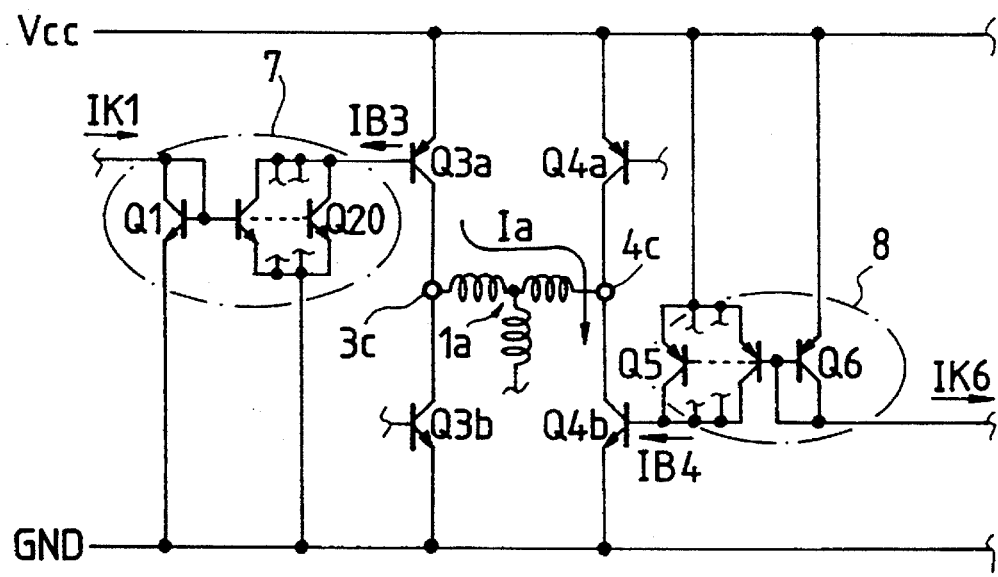
FIG. 2 is a circuit diagram including a drive circuit as its major part in a motor drive circuit prior to the present invention but not publicly known prior art.

In FIG. 1, numerals 70 and 80 are current mirror circuits of which circuits are the same as the current mirror circuits 7 and 8 but their connection is different. These current mirror circuits 70 and 80 drive an output stage transistor Q3a at a current flow-out side in one drive circuit and an output stage transistor Q4b at a current sink side in another drive circuit. Numeral 9 is a constant voltage generating circuit which generates a bias voltage for the current mirror circuits 70 and 80. Here the same or equivalent constituents as in FIG. 2 are designated by the same reference numerals and their explaration is omitted.

The current mirror circuit 70 is constituted by NPN transistors Q1 and Q20 of which emitters are connected in common and the collector of the transistor Q1 at the input side receives a flow-in current IK1 from a drive signal generating circuit 4. The transistor Q20 at the output side inverts and amplifies the same to generate a current signal IB3 at the collector side which is applied to the base of the output stage transistor Q3a.

The current mirror circuit 80 is constituted by PNP transistors Q6 and Q5 of which emitters are connected in common and the collector of the transistor Q6 at the input side receives a flow-out current IK6. The transistor Q5 is a multi emitter transistor and inverts and amplifies the flow-out current IK6 to generate a current signal IB4 at the collector side which is applied to the base of the transistor Q4b to drive same.

The current mirror circuit 70 is disposed upstream the current mirror circuit 80 and the emitters connected in common of the current mirror circuit 70 are connected to the emitters connected in common of the current mirror circuit 80. Further, a connection point A of these common emitters is connected to the constant voltage generating circuit 9 via a bias line Vs. Thereby a bias voltage higher by 2 Vf with respect to the ground line GND is applied to the connection point A (wherein 1 Vf represents a forward voltage between base and emitter of a transistor or a diode and 2 Vf implies 2×1 Vf, the same representation is used hereinbelow).

In the constant voltage generating circuit 9 wherein a current mirror circuit is constituted by transistors Q9a and Q9b, the transistor Q9b at the input side receives a current from a constant current source 9c. At the downstream of the transistor Q9a a constant voltage circuit composed of diodes D1 and D2 for level shifting is connected and through the constant voltage circuit the transistor Q9a is connected to the ground line GND. As a result, at the emitter side of the transistor Q9b a constant voltage 2 Vf determined by the diode D1 and D2 appears. The structure of the constant voltage generating circuit 9 is one of common constant voltage circuits.

The base voltage of the output stage transistor Q3a is determined by a voltage supplied together with the current of the current signal IB3. Further, since the emitter of the output stage transistor Q3a is connected to the power source line Vcc to which the power source voltage is applied, the transistor Q3a is operable, if a voltage as small as 1Vf is applied between the base-emitter of the transistor Q3a. Still further a voltage supplied with the current of the current signal IK1 shows substantially the same level as the supply voltage together with the current signal IB3 because of the characteristic of the current mirror circuit.

When the voltage level of the power source line Vcc is set at more than 3 Vf, for example 4 Vf, the voltage level for the current signals IK1 and IK3, which is used for generating a base current necessary for driving the transistor Q3a through the current mirror circuit 70, can be determined at a higher voltage level than the reference voltage 2 Vf at the bias line Vs. As a result, an operating current (in this instance IK1+Ib3) of the current mirror circuit 70 can be caused to flow-out to the bias line Vs.

Namely, the current mirror circuit 70 can be operated at a potential between the power source line Vcc and bias line Vs and the voltage drop therein is reduced by a voltage component of 2 Vf in comparison with the circuit shown in FIG. 2 wherein the downstream side is connected to the ground line GND. Accordingly, the power consumption therein is reduced by the corresponding voltage drop reduction in comparison with that in FIG. 2 which amounts to a power consumption saving of about 2 Vf x (IK1+IB3).

The above explained advantages are true with the current mirror circuit 80 wherein since the NPN transistor of which emitter side is connected to the ground line GND is used as the output stage the base voltage of the transistor Q6 which is driven by the current signal IK6 is maintained at a higher voltage than the ground line GND by a slightly higher voltage than 1Vf. Moreover the driving mode is that which a current is caused to flow-in into the base of the output stage transistor therefore the drive current which flows out from the upstream current mirror circuit 70 can be used as it is for the driving.

Further, the base voltage of the transistor Q4b which is driven by the current signal IB4 is also maintained at a higher voltage than the ground line GND by a slightly higher voltage than 1 Vf. On the other hand, the potential of the bias line Vs is at 2 Vf. Therefore, the current mirror circuit 80 can be operated at a potential between the bias line Vs and the ground line GND and the voltage drop therein is reduced by a voltage component corresponding to 2 Vf in comparison with the circuit shown in FIG. 2 wherein the upstream side is connected to the power source line Vcc. Accordingly, the power consumption is reduced by the corresponding voltage drop reduction which amounts to a power consumption saving of about (Vcc−2 Vf)×(IK6+IB4). Wherein Vcc in the above formula is a voltage of the power source line.

The reference voltage 2 Vf which is generated by the constant voltage generating circuit 9 is an intermediate voltage between the power source voltage Vcc and the ground potential GND.

When a drive circuit is constituted by a pair of output stages for current flow-out and current sink, it is usually sufficient if the sum of the flow-out current from the upstream is sinked at the current sink side. Therefore if the amount of current which flows out from a current mirror circuit 70 for one drive circuit or another current mirror circuit 70 for another drive circuit to the bias line Vs is equal to the amount of current which is sinked by one current mirror circuit 80 which drives one current sink side or another current mirror circuit 80 which drives another current sink side, there is no current which flows in or out from the bias line Vs. However, in an actual operation there appears a difference between the two current amounts, therefore the current flowing through the downstream current mirror circuit 80 is in advance set larger than that flowing through the upstream current mirror circuit 70. With this arrangement, a current corresponding to the exceeding portion is supplied from the bias line Vs to the downstream current mirror circuit. Accordingly, a current always flows-in to the downstream current mirror circuit and even when the flow-out current from the upstream current mirror circuit temporarily increases a normal operation can be continued only by decreasing the current amount flowing from the bias line Vcc. Namely, with the above measure no current which is drawn in into the bias line Vs is generated so that the constant voltage generating circuit 9 of the simple structure as shown in FIG. 1 can be used which is designed to have only a function for flowing out a current.

In the present embodiment, the current signal IB4 at the current sink side is set larger than the current signal IB3 at the current flow-out side. This setting can be realized by selecting the respective transistors Q3a and Q4b and/or the respective current mirror circuits 70 and 80 in such a manner that the current signal IB4 and the current signal IB3 show the above relationship.

Further, the voltage drop from the power source line Vcc to the reference voltage line (2 Vf) is their difference voltage, in that (Vcc−2 Vf). Therefore, in the constant voltage generating circuit 9 a power consumption of about (Vcc−2 Vf)×{(IK6+IB4)−(IK1+IB3)} is generated. However, when summing up the above saving amount and the present increasing amount, a power consumption of Vcc x (IKI+IB3) is saved.

In case of a specific motor drive circuit which is formed into an IC circuit including upto the output stage transistors and which has the following specification, in that, power source voltage Vcc of 3 V, base current IB3 of 0~20 mA, base current IB4 of 0~30 mA and motor drive current for three phase motor of 0~80 mA, the circuit according to FIG. 4 showed that a power consumption at the output stage transistor portion was about 250 mW and a power consumption at the other portions in the motor drive circuit was about 200 mW, on the other hand, the circuit according to the present invention showed that a power consumption of about 70 mW was saved at the output stage transistor portion which amounts to about 15% power consumption reduction in the entire motor drive circuit.

Further, when there exists a suitable circuit which generates a constant voltage between the power source line Vcc and the ground line GND, the circuit can be used to serve as the constant voltage generating circuit 9. Still further, even in a case wherein the ground line GND is connected to a negative power source voltage, the relationship with regard to potentials applied at respective terminals in the respective circuits is identical and only difference is that the entire potential is merely shifted to the negative side.

Figure 3:
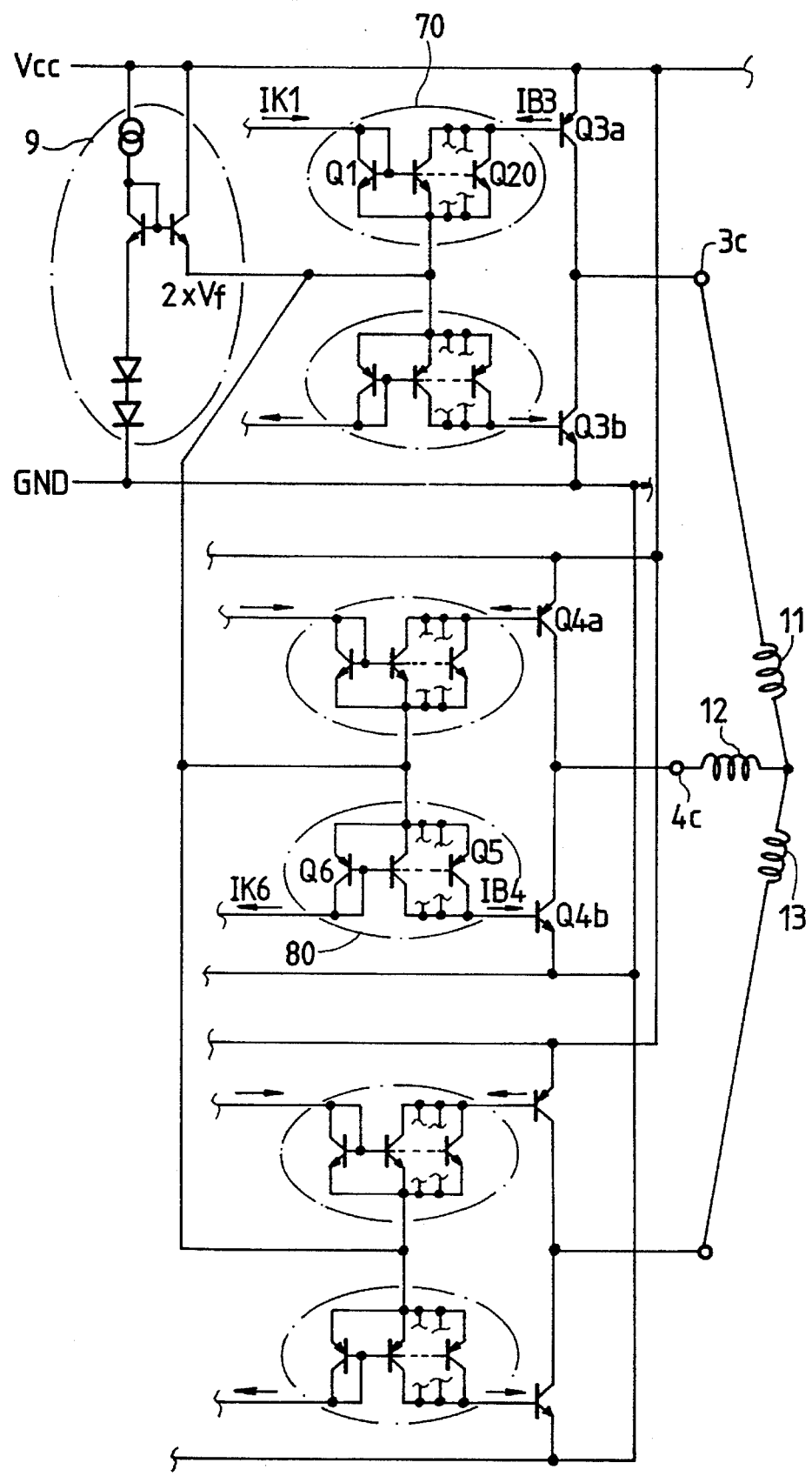
FIG. 3 is an explanatory view wherein the drive circuit in FIG. 1 is developed into a three phase circuit.

Hereinabove, the explanation is pricipally directed to the operation of the circuit, and the pair of output stage transistors and the current mirror circuits therefor, which cause to flow-in a current into the one coil 1a connected between the output stages of the drive circuit 5 and to sink the current flowing-out therefrom, are explained. However, the relationship between the other coils connected between the output stages of the drive circuit 5 and the other drive circuit is identical as the above. When applying this relationship to all of the coils and drive circuits, the structure as illustrated in FIG. 3 results in, in that all of the common emitters of the current mirror circuits which drive the output stage transistors at the current flow-out side in the respective drive circuits are connected to the bias line Vs and all of the common emitters of the current mirror circuits which drive the output stage transistors at the current sink side in the respective drive circuits are connected to the bias line Vs. Further, a plurality of constant voltage generating circuits each corresponding to the respective phases can be provided according to FIG. 1, however such provision will increase power consumption.

In case of a single phase, the coil 1a itself corresponds to the single phase coil, accordingly, the current flow-out side and the current sink side constitute a pair of output stage transistors for a drive circuit in which case the transistor Q4b in FIG. 1 is replaced by the transistor Q3b and the current mirror circuit 80 functions as a current mirror circuit for the transistor Q3b.

In case of a double phase, since the respective two coils correspond to the coil 1a, it is satisfactory when the upper and lower current mirror circuits provided for the corresponding drive circuits for the respective coils are simply connected to the bias line Vs.

The major portion of the present invention independent from the connection configuration and the phase number of the coils, but is directed to the output stage transistors in the drive circuit and is not affected by the kinds of motors and the connection configurations of the coil to be employed. Further, depending upon coil connection methods in motors the output stage transistor which outputs a motor drive current and the output stage transistor at the sink side which receives a circulating current flowing out from the coil do not necessarily correspond one to one. However, when noting at the respective drive circuits in their output stages, a completely identical operation is performed with regard to the power consumption.

I claim:

1. A motor drive circuit comprising:
   an upstream side line from which a current flows out;
   a downstream side line having a lower potential than that of said upstream side line which receives the flow-out current;
   a reference voltage line having an intermediate potential between those of said upstream side line and of said downstream side line;
   a first output stage transistor which causes to flow out the current from said upstream side line to a coil in a motor;
   a first current mirror circuit which is disposed between said upstream side line and said reference voltage line and is adapted to drive said first output stage transistor;
   a second output stage transistor which receives a current flowing out from the coil in said motor; and
   a second current mirror circuit which is disposed between said reference voltage line and said downstream side line and is adapted to drive said second output stage transistor.

2. A motor drive circuit according to claim 1, wherein said upstream side line is a power source voltage line and said downstream side line is a ground line.

3. A motor drive circuit comprising:
   a first output stage transistor which causes to flow out a current received from an upstream side line into a coil in a motor;
   a second output stage transistor which causes to flow a flow-out current flowing out from the coil in said motor into a downstream side line;
   a first current mirror circuit which drives said first output stage transistor upon receipt of a first current signal which determines an output current waveform of said first output stage transistor;
   a second current mirror circuit which drives said second output stage transistor upon receipt of a second current signal for sinking the flow-out current; and
   a constant voltage generating circuit which generates a reference voltage having a predetermined intermediate potential between a potential of the upstream side line and a potential of the downstream side line, said first current mirror circuit is provided between the upstream side line and a line which receives the reference voltage and said second current mirror circuit disposed between the line which receives the reference voltage and the downstream side line.

4. A motor drive circuit according to claim 3, wherein the upstream side line is a power source line, the downstream side line is a ground line, said first output stage transistor is a PNP type transistor, said second output stage transistor is an NPN type transistor, said first current mirror circuit inverts and amplifies the first current signal and drives the base of said first output stage transistor and said second current mirror circuit inverts and amplifies the second current signal and drives the base of said second output stage transistor.

5. A motor drive circuit according to claim 4, wherein said constant voltage generating circuit is a current flow-out type circuit and an amount of current for driving the base of said second current mirror circuit is set larger than an amount of current for driving the base of said first current mirror circuit.

6. A motor drive circuit according to claim 4, wherein said motor is a three phase motor and said first and second output stage transistors and said first and second current mirror circuits associated with said corresponding first and second output stage transistors are provided for the respective phases.

7. A motor drive circuit according to claim 6, wherein said constant voltage generating circuit is a current flow-out type circuit and a sum of respective currents for three phases for driving the bases of said second current mirror circuits for the respective phases is set larger than a sum of respective currents for three phases for driving the bases of said first current mirror circuits for the respective phases.

8. A motor drive circuit according to claim 4, wherein the potential of said power source line is set to be equal to or more than four times of the forward voltage of the first output stage transistor, and the potential of said reference voltage line is set to be equal to or more than two times of the forward voltage of the second output stage transistor and the difference thereof from the power source voltage line is equal to or more than two times of the forward voltage.

9. A motor drive circuit according to claim 4, wherein said first current mirror circuit includes an NPN type transistor at the input side and a multi emitter type NPN transistor, the emitter side thereof are connected in common to the line receiving the reference voltage, the collector of the NPN transistor at the input side receives the first current signal as the flow-in current and the collector of the multi emitter type NPN transistor at the output side is connected to the base of the first output stage transistor, said second current mirror circuit includes a PNP type transistor at the input side and a multi emitter type PNP transistor at the output side, the emitter side thereof is connected in common to the line receiving the reference voltage, the collector of the PNP transistor at the input side receives the second current signal as the flow-out current therefrom, and the collector of the multi emitter type PNP transistor at the output side is connected to the base of the second output stage transistor.

10. A motor drive system comprising:
    a motor;

an upstream side line from which a current flows a downstream side line having a lower potential than that of said upstream side line which receives the flow-out current;

a reference voltage line having an intermediate potential between those of said upstream side line and of said downstream side line;

a first output stage transistor which causes to flow out the current from said upstream side line to a coil in said motor;

a first current mirror circuit which is disposed between said upstream side line and said reference voltage line and is adapted to drive said first output stage transistor;

a second output stage transistor which receives a current flowing out from the coil in said motor; and a second current mirror circuit which is disposed between said reference voltage line and said downstream side line and is adapted to drive said second output stage transistor.

11. A motor drive system, comprising:

a motor;

a first line providing a first voltage;

a second line having a lower second voltage than said first line;

a first output stage transistor coupled to said motor to flow out current from said first line to a coil in said motor;

a first current mirror circuit coupled between said first line and a reference voltage having an intermediate potential between those of said first line and of said second line, and coupled to drive said first output stage transistor;

a second output stage transistor coupled to said motor to receive a current flowing out from a coil in said motor; and a second current mirror circuit coupled between said second line and the reference voltage having an intermediate potential between those of said first line and of said second line, and coupled to drive said second output stage transistor.

12. A motor drive system according to claim 11, wherein one of said first and second output stage transistors is a PNP transistor and the other of said first and second output stage transistors is an NPN transistor.

13. A motor drive system according to claim 12, wherein each of said PNP and NPN transistors has an emitter directly coupled to a respective one of said first and second lines.

14. A motor drive system according to claim 13, further including a reference voltage producing circuit coupled between said first line and said second line to produce the reference voltage for said first current mirror circuit and the reference voltage for said second current mirror circuit.

15. A motor drive system according to claim 14, wherein said reference voltage producing circuit produces the reference voltage as a single constant voltage having a fixed relationship with respect to the first and second voltages of said first and second lines.

16. A motor drive system according to claim 11, further including a reference voltage producing circuit for producing a single constant reference voltage having a fixed relationship with respect to the first and second voltages of said first and second lines, as the reference voltage for said first and second current mirror circuits.

17. A motor drive system according to claim 11, further including a reference voltage producing circuit coupled between said first line and said second line to produce the reference voltage for said first current mirror circuit and the reference voltage for said second current mirror circuit.

18. A motor drive system according to claim 17, wherein said reference voltage producing circuit produces the reference voltage as a single constant voltage having a fixed relationship with respect to the first and second voltages of said first and second lines.

19. A motor drive system according to claim 17, further including a reference voltage producing circuit for producing a single constant reference voltage having a fixed relationship with respect to the first and second voltages of said first and second lines, as the reference voltage for said first and second current mirror circuits.

* * * * *